United States Patent
Hwang et al.

(10) Patent No.: US 8,418,331 B2
(45) Date of Patent: Apr. 16, 2013

(54) METHOD OF FABRICATING A DUPLEXER USING AN EMBEDDED PCB

(75) Inventors: Jun-sik Hwang, Ohsan-si (KR); Yun-kwon Park, Dongducheon-si (KR); Il-jong Song, Seoul (KR); Byeoung-ju Ha, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/006,052

(22) Filed: Jan. 13, 2011

(65) Prior Publication Data
US 2011/0107570 A1    May 12, 2011

Related U.S. Application Data

(62) Division of application No. 10/923,086, filed on Aug. 23, 2004, now Pat. No. 7,893,792.

(30) Foreign Application Priority Data

Aug. 21, 2003   (KR) .................................. 2003-58072

(51) Int. Cl.
*H04R 17/10*   (2006.01)
*H05K 3/30*   (2006.01)

(52) U.S. Cl.
USPC ................ 29/25.35; 29/594; 29/830; 29/832; 29/852; 174/255; 174/261; 310/313 A (58) Field of Classification Search .................... 29/594, 29/25.35, 25.41, 830, 832, 846; 310/363–366; 174/255, 261; 333/133, 129, 126
See application file for complete search history.

(56) References Cited

U.S. PATENT DOCUMENTS

| 5,896,650 | A  | * | 4/1999  | Nishide et al. ................. 29/830 |
| 5,910,756 | A  |   | 6/1999  | Ella |
| 6,239,536 | B1 | * | 5/2001  | Lakin ........................... 310/364 |
| 6,351,194 | B2 |   | 2/2002  | Takahashi et al. |
| 6,356,455 | B1 | * | 3/2002  | Carpenter ................. 174/255 X |
| 6,424,238 | B1 |   | 7/2002  | Penunuri |
| 6,778,038 | B2 |   | 8/2004  | Takeishi et al. |
| 6,927,649 | B2 |   | 8/2005  | Metzger et al. |
| 2002/0153965 | A1 | | 10/2002 | Ruby et al. |
| 2003/0090338 | A1 | | 5/2003  | Muramatsu |
| 2003/0151477 | A1 | | 8/2003  | Hirabayashi et al. |
| 2004/0029356 | A1 | | 2/2004  | Timme et al. |
| 2004/0130410 | A1 | | 7/2004  | Nishimura et al. |

FOREIGN PATENT DOCUMENTS

| JP | 05267971 A | * | 10/1993 |
| JP | 8-330473 A |   | 12/1996 |
| JP | 10-321970 A |  | 12/1998 |

(Continued)

*Primary Examiner* — A. Dexter Tugbang
(74) *Attorney, Agent, or Firm* — Sughrue Mion, PLLC (57) ABSTRACT

Provided is a method for fabricating a duplexer. The method includes fabricating an embedded PCB having an isolation part built therein and forming pads on certain areas of an upper side of the embedded PCB to connect with an external terminal. Further, a first filter and a second filter are separately fabricated, each having at least one film bulk acoustic resonator which is fabricated by depositing a lower electrode, a piezoelectric layer, and an upper electrode in this respective order. Thereafter, the first and second filters are bonded onto the pads formed on the embedded PCB. The entire surface of the embedded PCD is packaged at a predetermined distance from the first and second filters.

7 Claims, 10 Drawing Sheets

FOREIGN PATENT DOCUMENTS

| | | |
|---|---|---|
| JP | 2001-24476 A | 1/2001 |
| JP | 2002-92427 A | 3/2002 |
| JP | 2002-185149 A | 6/2002 |
| JP | 2002-344349 A | 11/2002 |
| JP | 2003-174265 A | 6/2003 |
| JP | 2003-179518 A | 6/2003 |
| JP | 2003-198325 A | 7/2003 |
| WO | 02/058233 A1 | 7/2002 |

* cited by examiner

METHOD OF FABRICATING A DUPLEXER USING AN EMBEDDED PCB

CROSS-REFERENCE TO RELATED APPLICATIONS

This application is a divisional of U.S. application Ser. No. 10/923,086, filed Aug. 23, 2004, which claims the benefit of Korean Patent Application No. 2003-58072, filed Aug. 21, 2003 in the Korean Intellectual Property Office, the disclosure of which is incorporated herein by reference in its entirety.

BACKGROUND OF THE INVENTION

1. Field of the Invention

The present invention generally relates to a duplexer and a duplexer fabrication method, and more specifically, to a high-integrated duplexer fabricated using an embedded printed circuit board and a duplexer fabrication method thereof.

2. Description of the Related Art

A duplexer is a representative example of elements, which compositely uses a filter. The duplexer splits signals transmitted/received through one antenna in a frequency division duplex (FDD) type communication system so that it can serve to efficiently share the same antenna.

The duplexer basically includes a transmitter filter and a receiver filter. The transmitter filter is a band pass filter for passing only a frequency to transmit, and the receiver filter is a band pass filter for passing only a frequency to receive. The duplexer can perform the signal transmission/reception through the single antenna by varying the frequencies passing through the transmitter filter and the receiver filter.

With the rapid spread of mobile appliances, such as cellular phones, demand for a small-sized and lightweight duplexer used in such an appliance has been increasing. Also, demand for a small-sized and lightweight filter has been increasing, which serves as the transmitter filter and the receiver filter as internal components of the duplexer. To implement the small size and the lightweight filter for high power, an FBAR (Film Bulk Acoustic Resonator) is usually used because it can be mass-produced at a minimum cost and can be implemented with a minimum size. The FBAR can obtain a high quality factor (Q) value that is the principal characteristic of the filter, can be used in a micro-frequency band, and can be implemented up to PCS (Personal Communication System) and DCS (Digital Cordless System) bands.

Since the difference between the frequencies of the signals transmitted/received through the transmitter filter and the receiver filter is small, the signals are quite sensitive to inter-signal interference. Accordingly, a duplexer having an improved performance can be fabricated by adding an isolation part that prevents the inter-signal interference and by isolating the transmitter filter and the receiver filter from each other. The isolation part implements a phase shifter using a capacitor and a resistor, and prevents the inter-signal interference by making the phase difference between the frequencies of the transmitted signal and the received signal 90°.

Figure 1A:
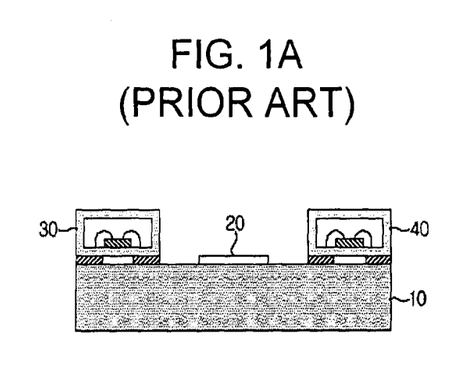
FIGS. 1A and 1B are cross-sectional views illustrating the structure of duplexers fabricated according to a conventional method.
Figure 1B:
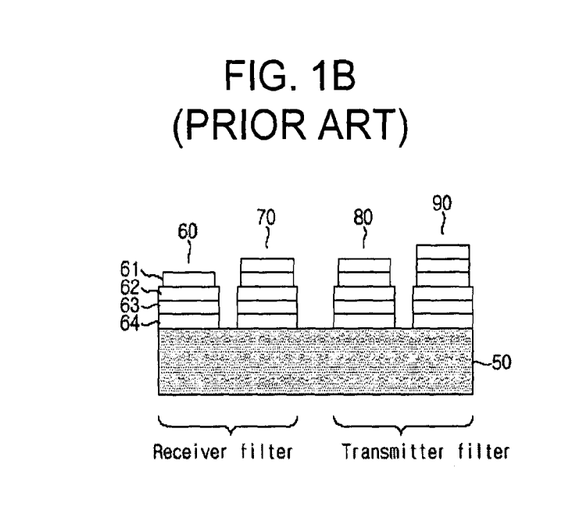

FIGS. 1A and 1B show the constructions of the duplexer fabricated by using the conventional FBAR.

FIG. 1A shows the duplexer fabricated in a manner that a transmitter filter 30 and a receiver filter 40 are prepared respectively, and bonded onto a printed circuit board (PCB) 10 with an isolation part 20 for isolating the two filters 30, 40 from each other the two filters 30 and 40 by using a hybrid.

The PCB 10 is a circuit board fabricated in a manner that various parts are densely embedded onto a flat board which is made of a phenol resin or an epoxy resin, and a circuit connecting the parts is densely integrated onto and fixed to the surface of the flat board.

The transmitter filter 30 and the receiver filter 40 are respectively connected to an external electrode through a wire bonding method. The transmitter filter 30 and the receiver filter 40 are packaged separately and coupled to each other. The isolation part 20, which is separately fabricated, is bonded onto the flat board in the same process to fabricate the duplexer. However, in case of the wire bonding, there is a problem that a performance of an element is deteriorated due to a loss in the wiring and an increase in parasitic components. In addition, the final size of the duplexer element is increased due to the packaging size of the respective filters 30, 40 and the size of the isolation part 20 bonded between the filters 30, 40. Hence, the duplexer is not suitable for use in the miniaturized appliance such as a cellular phone and its fabricating cost is increased.

FIG. 1B shows a duplexer built on a substrate using a Bragg type FBAR, which has a structure wherein a lower electrode 63, a piezoelectric layer 62, and an upper electrode 61 are deposited in order on a reflector layer 64 formed by depositing, in layers, materials having a large difference in acoustic impedance, as a transmitter/receiver filter. As shown in FIG. 1B, the receiver filter includes a serial resonator 60 and a parallel resonator 90, and the transmitter filter includes a serial resonator 80 and a parallel resonator 90, all of which are integrated onto one substrate 50. The Bragg type duplexer is fabricated on one substrate to realize a one-chip fabrication and has a strong structure. However, the Bragg type duplexer has problems in that it is difficult to accurately adjust the width of the respective layers, and the film is easily cracked due to the stress caused by the forming of the thick reflector layer. Furthermore, the Bragg type duplexer has a considerably lower Q value in comparison to a duplexer using an air gap type FBAR.

In addition, due to the absence of an isolation part to prevent interference between the transmitter filters 60, 70 and the receiver filters 80, 90, much noise may be generated.

SUMMARY OF THE INVENTION

Accordingly, an aspect of the present invention is to provide a duplexer fabricated using an embedded printed circuit board (PCB) having an isolation part therein and a fabrication method thereof.

The duplexer includes a first filter to pass a signal of a transmitted frequency band, a second filter to pass a signal of a received frequency band, an embedded PCB having the first and second filters bonded onto a surface at a predetermined distance from each other, and an isolation part to prevent signal interference between the first and second filters, and a packaging substrate to package the entire upper side of the embedded PCB from above at a predetermined distance from the first and second filters.

At least one of the first filter and the second filter includes at least one film bulk acoustic resonator which is fabricated by depositing a lower electrode, a piezoelectric layer, and an upper electrode in order. The first and second filters are bonded by a bumping method using a conductive bump, which bonds the first and second filters onto the upper side of the embedded PCB with a predetermined air gap therebetween.

The isolation part prevents interference by making a phase difference of 90° between the frequencies of the signals inputted to the first and second filters.

The isolation part includes a capacitor and a coil. The capacitor and the coil are fabricated by depositing a first metal layer, a dielectric, and a second metal layer on both sides of the PCB in order. Alternatively, the isolation part includes a transmission line fabricated between the plural PCBs deposited in order and having a length corresponding to ¼ of the frequency of the signal passed by the first filter or the second filter.

A duplexer fabrication method according to the present invention includes the steps of (a) fabricating an embedded PCB having an isolation part built therein, (b) forming plural pads on certain areas of an upper side of the embedded PCB, to connect with an external terminal, (c) separately fabricating a first filter and a second filter, each having at least one film bulk acoustic resonator which is fabricated by depositing a lower electrode, a piezoelectric layer, and an upper electrode in order, (d) bonding the first and second filters respectively onto the plural pads formed on the embedded PCB, and (e) packaging the entire surface of the embedded PCB at a predetermined distance from the first and second filters respectively.

The isolation part uses a LC part including a capacitor and a coil. The capacitor and the coil are fabricated by depositing a first metal layer, a dielectric, and a second metal layer on both sides of the PCB in order.

The step of fabricating the embedded PCB having the isolation part therein includes the steps of depositing the first metal layer on both sides of the PCB, depositing a photo resist layer on the first metal layer and forming a lower pattern of the coil by etching, depositing a first prepreg and the dielectric in order on the lower pattern of the coil, and patterning the dielectric in a predetermined pattern, depositing a second prepreg and a second metal layer on the patterned dielectric in order, fabricating an upper pattern of the coil by half-etching and patterning the second metal layer, exposing the lower pattern of the coil by drilling an area where the second metal layer is removed by the patterning, connecting the lower and upper patterns of the coil by metal-plating the drilled area, fabricating the coil by partially etching the metal-plated area, and depositing a third prepreg and a third metal layer on the coil in order.

The isolation part includes a transmission line fabricated between the plural PCBs deposited in order and having a length corresponding to ¼ of the frequency of the signal passed by the first filter or the second filter.

The step (b) includes the steps of forming two through-holes by penetrating certain areas of the embedded PCB, plating upper and lower surfaces of the embedded PCB and both sidewalls of the through-hole with a fourth metal layer, providing a solder resist on an inside of the plated through-hole and the upper and lower surfaces of the embedded PCB, and plating the upper and lower surfaces of the embedded PCB with a fifth metal layer at an area where the solder resist is not deposited.

The step (d) includes the steps of fabricating a conductive bump respectively on an upper portion of the plural pads, and bonding the first and second filters respectively to the conductive bump at a predetermined air gap with respect to the upper side of the embedded PCB.

The step (e) may include the steps of fabricating a packaging substrate by etching a certain area of an additional PCB, coating a bonding material on an area except the etched area on the PCB, and bonding the packaging substrate to the embedded PCB so that the first and second filters are located in the etched area and spread away each other at a predetermined distance.

As a result, the high-integrated duplexer having the isolation part in the PCB is fabricated.

BRIEF DESCRIPTION OF THE DRAWING FIGURES

The above aspects, and other features and advantages of the present invention will become more apparent after a reading of the following detailed description when taken in conjunction with the drawing figures, in which.

DETAILED DESCRIPTION OF THE INVENTION

Hereinafter, the present invention will be illustrated in detail with reference to the annexed drawing figures.

Figure 2:
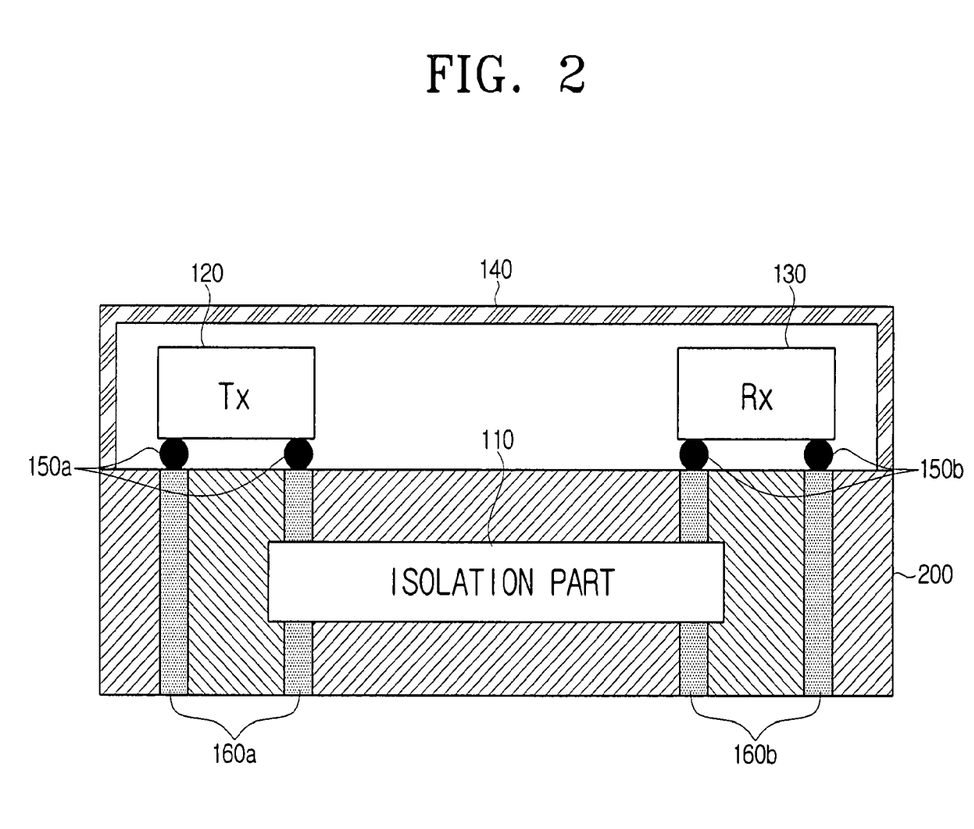
FIG. 2 is a cross-sectional view illustrating the structure of a duplexer using an embedded printed circuit board (PCB) fabricated according to an embodiment of the present invention.

FIG. 2 is a view showing the structure of a duplexer finally fabricated according to an exemplary embodiment of the present invention. Referring to FIG. 2, on an embedded PCB (printed circuit board) 200 having an isolation part 110 and pads 160a, 160b, a transmitter filter 120 and a receiver filter 130 are bonded using ball bumps 150a, 150b. A packaging substrate 140 is bonded to the embedded PCB 200 with a predetermined distance from an upper portion of the transmitter filter (hereinafter, "first filter") 120 and the receiver filter (hereinafter, "second filter") 130.

The embedded PCB 200 is a PCB having passive elements such as an inductor, a capacitor and a resistor therein. The PCB is fabricated in a manner that a layer such as a copper diaphragm is attached on a side of a phenolic resin insulating board or an epoxy resin insulating board and a required circuit is patterned by etching (removing except for the circuit on the board) along a wiring pattern of the circuit. The embedded PCB 200 is fabricated by depositing the several PCBs and building an inductor and a capacitor therein. In one embodiment, the embedded PCB 200 is fabricated in a structure having the built-in isolation part 110 between the PCBs.

The first filter 120 and the second filter 130 are band pass filters which pass frequencies to be transmitted/received and cut off other frequencies. In order to fabricate a small-sized and lightweight duplexer having high efficiency, the first and second filters 120, 130 may be fabricated using more than one film bulk acoustic resonator (hereinafter, "FBAR").

The FBAR is fabricated in a structure that a lower electrode, a piezoelectric layer, and an upper electrode are deposited in that order. If a voltage is applied to the upper and lower electrodes, an electric field is generated between the two electrodes, and the piezoelectric layer produces a piezoelectric phenomenon that converts the electric field into a mechanical energy in the form of an acoustic wave to generate resonance. Accordingly, the FBAR can serve as a band pass filter to selectively pass signals of a frequency band in which resonance is generated. Meanwhile, the first and second filters 120, 130 may be implemented as a single filter by connecting several FBARs.

The first and second filters 120, 130 are respectively bonded to the pads 160a, 160b fabricated on the embedded PCB 200 through a bumping method. The pads 160a, 160b are fabricated to electrically connect the first the second filters 120, 130 with an external electrode.

In connecting using conventional wire bonding method, there are problems such as limitation in expanding lead (a passage for transmitting an electrical signal) and loss at the wire. Hence, in the present embodiment, the first and second filters 120, 130 are electrically connected to the embedded PCB 200 using the bumping method.

The bumping method is performed by forming conductive balls 150a and 150b, which are external terminals in the form of protrusions having a size ranging from tens of μm to hundreds of μm, on the pads 160a, 160b with a metal material such as gold or solder and connecting the pads 160a, 160b with the two filters 120, 130 by the bumps 150a, 150b. In detail, the electrodes of the first and second filters 120, 130 are respectively connected to the conductive pads 160a, 160b on the embedded PCB 200 through the conductive bumps 150a, 150b alone. Hence, the length of the electrical wiring is shortened and an electrical resistance and noise are lessened to thereby enhance the electrical performance.

The bumping method can be divided into an electroplating method which extracts metal by using a rectifier, and an electroless plating method which extracts metal by using a reducing agent. According to the metal material being used, the bumping method may be classed into a gold (Au) bumping method, a solder bumping method, and a Ni/Cu bumping method. The gold (Au) bumping method is classified into a gold (Au) electroplating bumping method and an Au Stud bumping method. The solder bumping method is classed into a vapor deposition method, an electroplating method, a printing method, and a robotic ball placement method. In this embodiment, the electroplating method of the solder bumping method may be used, which is suitable for the mass production and the accurate bumping fabrication.

In bonding the first and second filter 120, 130 by using the conductive bumps 150a, 150b, an air gap may be defined among the embedded PCB 200 and the first filter 120 and the second filter 130. The air gap prevents an acoustic wave generated in the first and second filters 120, 130 from being absorbed by the embedded PCB 200, to thereby obtain a high quality factor Q.

The isolation part 110 in the embedded PCB 200 prevents inter-signal interference from being generated between the signals processed by the first filter 120 and the second filter 130. In a system transmitting/receiving the signals using a single antenna such as cellular phones, the interference generated between the transmitted signal and the received signal causes much noise. To prevent this, the isolation part 110 is included.

The isolation part 110 may be used as a phase shifter which shifts the phases of the frequencies to the transmitter and the receiver so that the phases of the frequencies have a phase difference of 90°. If the transmitted signal to the receiver is in the form of sin θ, the receiver signal having the phase difference of 90° by the isolation part 110 becomes cos θ(∵ sin (90+θ)=cos θ). As a result, for sin θ*cos θ=0, the signals do not affect each other.

The isolation part 110 may be implemented by fabricating a LC part in which a capacitor and a coil are deposited in order, or by a quarter-wave (λ/4) transmission line.

In detail, the phase difference of 90° is obtained with respect to an input by the LC parallel circuit which is formed by depositing the capacitor and the coil in order. Alternatively, The phase difference of 90° is obtained by implementing the transmission line having a quarter length of the wave λ of the transmitter signal and delaying the signal from the transmitter. A conventional duplexer has the structure with the isolation part 110 separately fabricated and bonded onto the PCB 200. According to the present embodiment, the isolation part 110 is built in the PCB 200 to reduce the entire size of the duplexer.

Meanwhile, the packaging substrate 140 is bonded at the upper portion of the embedded PCB 200 on which the first and second filters 120, 130 are bonded, at a predetermined distance from the first filter 120 and the second filter 130. The duplexer of FIG. 2 is fabricated by bonding the packaging substrate 140 so that the packaging substrate 140 seals and packages the PCB 200 to protect the PCB 200 from an external impact and to have the physical function and size, because the micro circuits such as the conductive bumps 150a, 150b, the first filter 120, and the second filter 130 are fragile.

A process of fabricating the duplexer of FIG. 2 is discussed below.

(a) The embedded PCB 200 is fabricated having the isolation part 110 therein. (b) The pads 160a, 160b are fabricated, and (c) the first filter 120 and the second filter 130 are separately fabricated, which include more than one FBAR on which the lower electrode, the piezoelectric layer, and the upper electrode are deposited in order. Next, (d) the fabricated first and second filters 120, 130 are respectively bonded to the pads 160a, 160b formed on the embedded PCB 200, and (e) entire surface of the embedded PCB 200 is packaged.

Figure 3A:
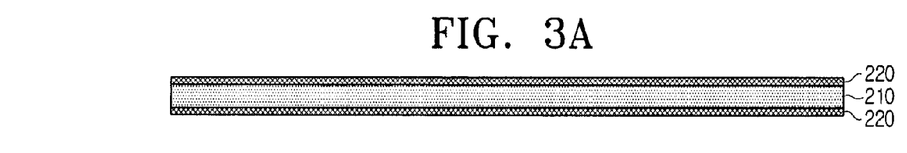
FIGS. 3A to 3P are cross-sectional views illustrating different steps for fabricating the embedded PCB having an inductor and a capacitor therein.
Figure 3B:
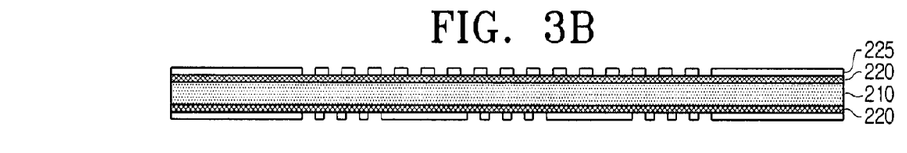
Figure 3C:
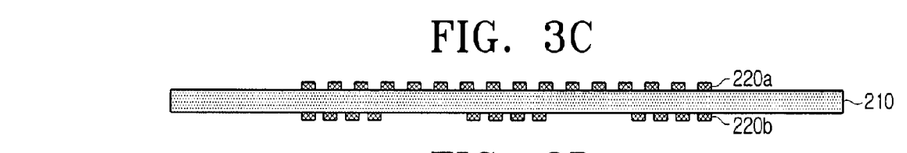
Figure 3D:
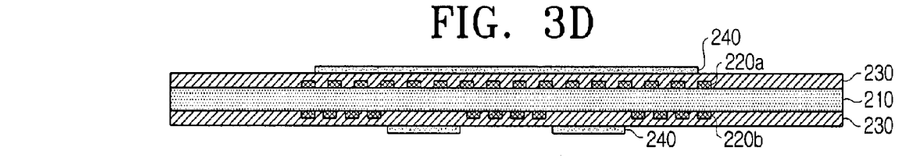
Figure 3E:
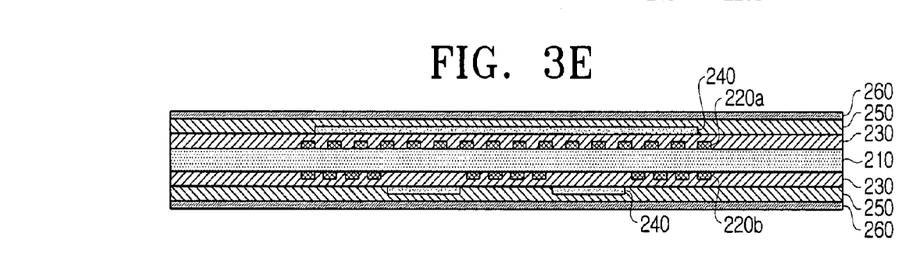
Figure 3F:
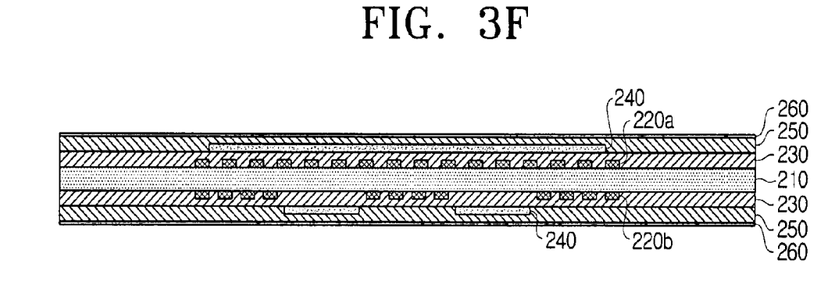
Figure 3G:
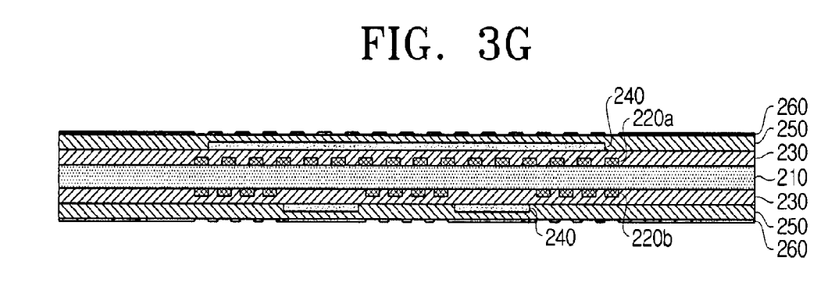
Figure 3H:
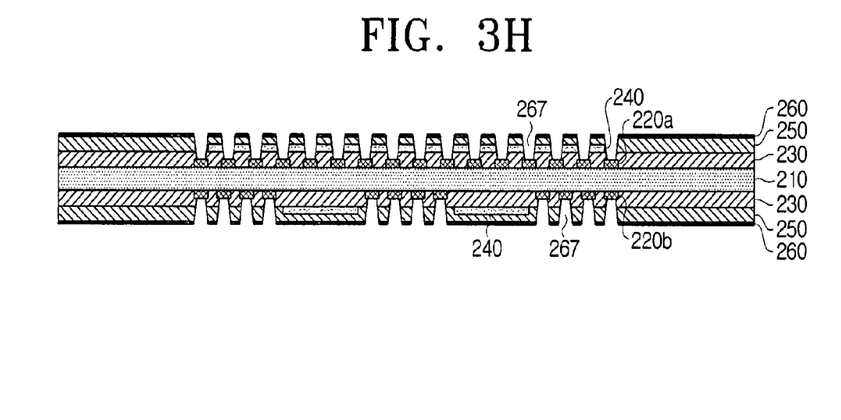
Figure 3I:
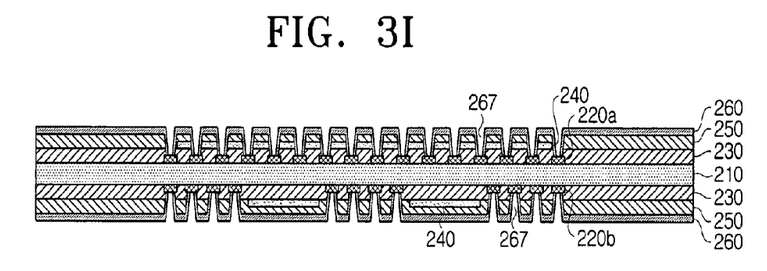
Figure 3J:
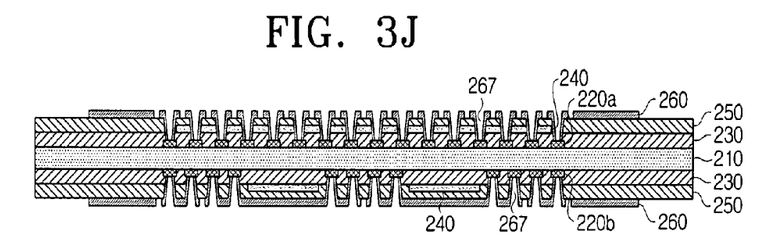
Figure 3K:
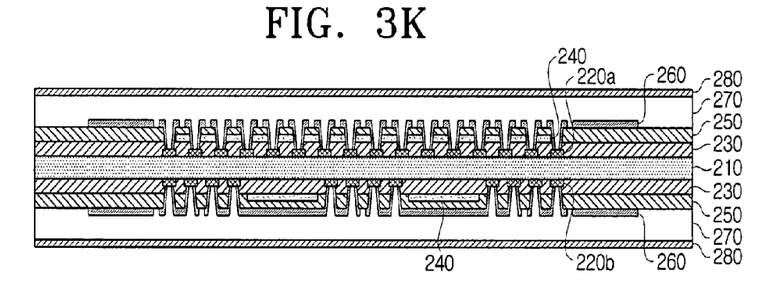
Figure 3L:
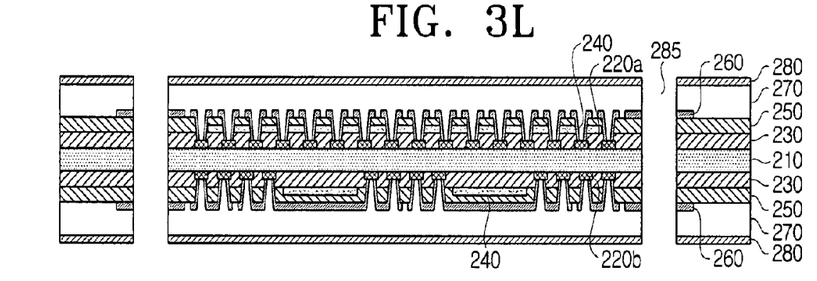
Figure 3M:
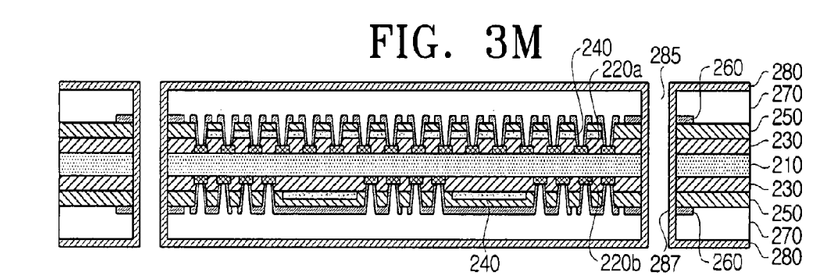
Figure 3N:
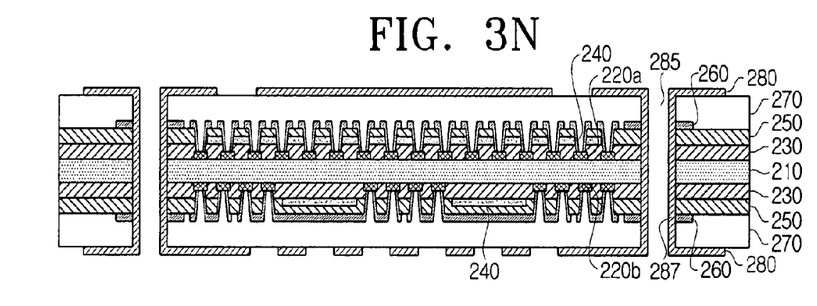
Figure 3O:
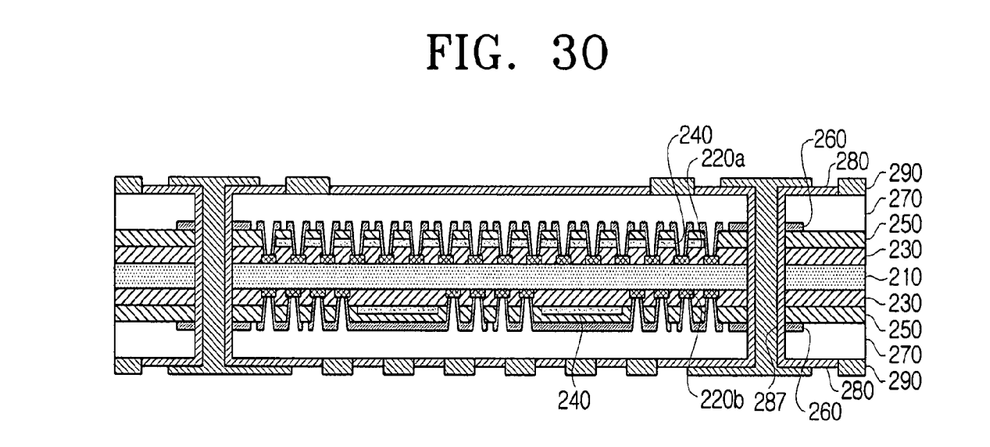
Figure 3P:
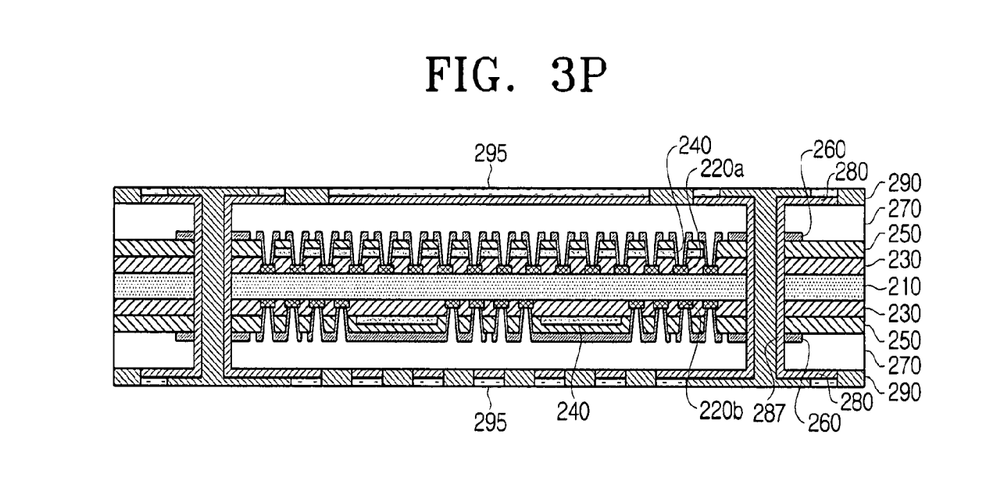
Figure 4A:
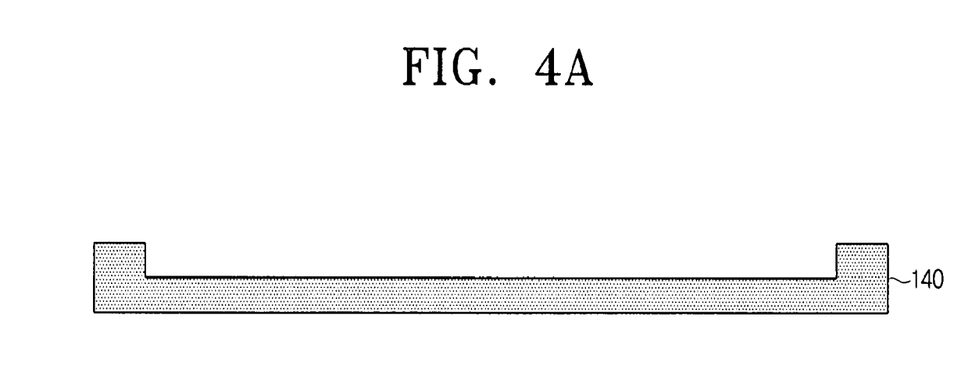
FIGS. 4A and 4B are cross-sectional views illustrating different steps for fabricating a packaging substrate packaging the duplexer according to an embodiment of the present invention.
Figure 4B:
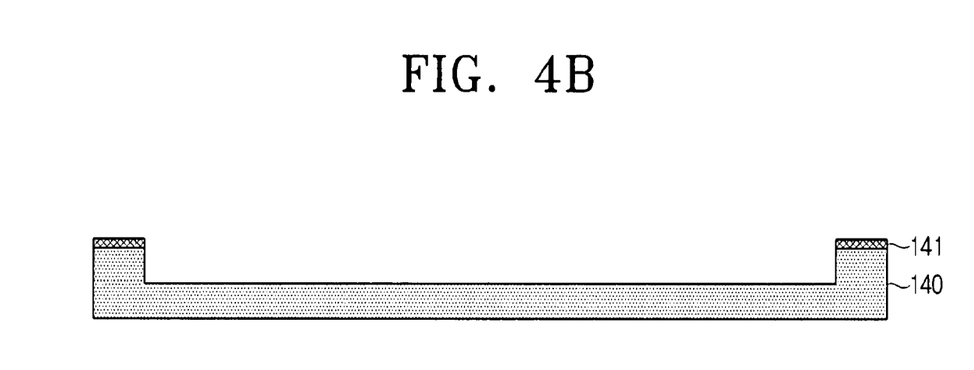
Figure 5A:
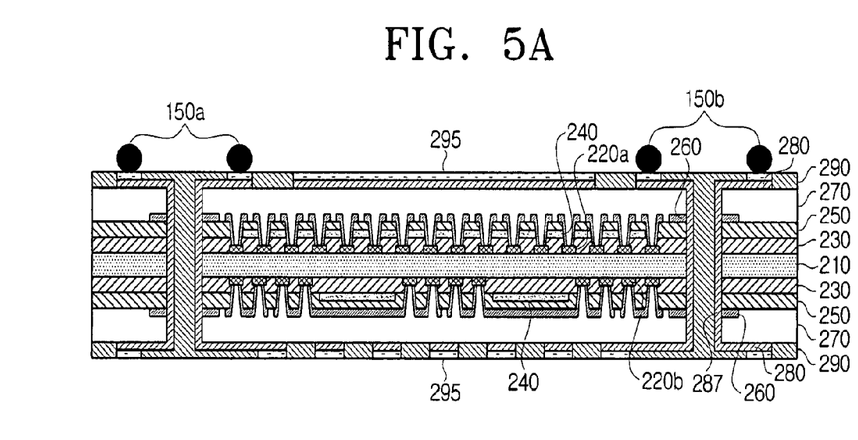
FIGS. 5A to 5C are cross-sectional views illustrating different steps for fabricating the structure of the duplexer fabricated using the embedded PCB having the inductor and the capacitor according to an embodiment of the present invention.
Figure 5B:
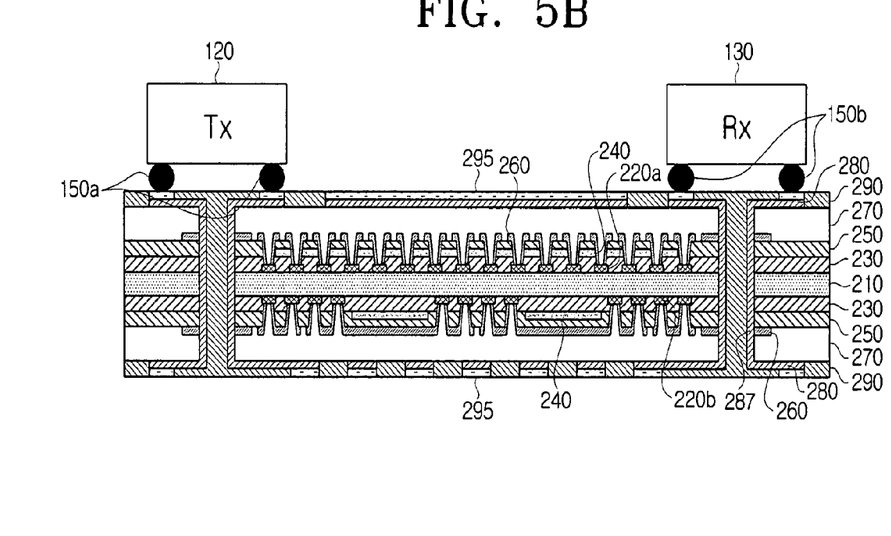
Figure 5C:
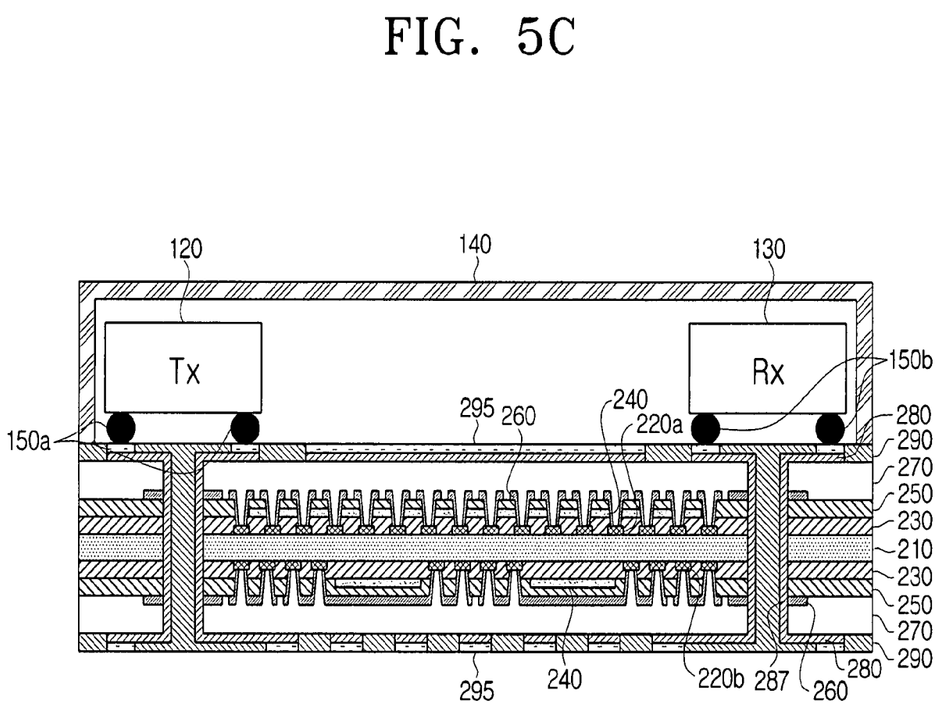

FIGS. 3A to 3P illustrate one exemplary embodiment of the present invention, in which the embedded PCB 200 is fabricated using the LC part as the isolation part 110 (FIGS. 3A to 3K), and the pads 160a, 160b are fabricated (FIGS. 3I to 3P). FIGS. 4A and 4B show the process of fabricating the packaging substrate 140, and FIGS. 5A to 5C show the process of bonding the embedded PCB 200, the first filter 120 and the second filter 130, and the packaging substrate 140.

FIG. 3A shows the structure that a first metal layer 220 is deposited on both sides of a PCB 210. Generally, copper is used for the first metal layer 220. Next, a photo resist layer 225 is deposited on a surface of the first metal layer 220 in a predetermined pattern as shown in FIG. 3B, and exposed and developed. Then, the first metal layer 220 is etched in a predetermined pattern, and lower patterns 220a, 220b of a coil are fabricated as shown in FIG. 3C. In the exposure process, the micro circuit pattern formed on a photo resist mask is transcribed to the coated photo resist layer 225 by irradiating light within an ultraviolet ray area of the light through the photo resist mask. The development is a process of resolving a PR area which has a weakened connection due to the exposure, by using a solvent.

FIG. 3D shows the process of depositing a first prepreg 230 and a dielectric 240 on the lower patterns 220a, 220b of the coil in order, and patterning them. The first prepreg 230 is a material having a proper adhesive property used for fabricating a multi-layer printed wiring board. The first prepreg 230 is softened by impregnating a thermosetting resin on a material such a glass fabric. The dielectric 240 is deposited to form the capacitor and may use a general insulating material.

A second prepreg 250 and a second metal layer 260 are deposited on the dielectric 240 in order (FIG. 3E), and the second metal layer 260 is half-etched (FIG. 3F). The half-etching process is performed to maintain an appropriate thickness of the second metal layer 260.

The half-etched second metal layer 260 is etched in a predetermined pattern to form an upper pattern 260 of the coil (FIG. 3G), and drilled to expose the lower patterns 220a, 220b of the coil (FIG. 3H). A drilling process forms a hole (via hole) so that the upper/lower circuits of the board are electrically connected. For this, a simple mechanical drilling method, a laser drilling method or a plasma drilling method may be used. A laser drilling method using a CO2 laser is widely practiced. The laser drilling method may use Nd-YAG laser for the micro fabrication.

Next, portion 267, exposed by the drilling, is metal-plated to connect the lower patterns 220a, 220b and the upper pattern 260 of the coil (FIG. 3I), and the upper pattern 260 is patterned to complete the coil (FIG. 3J). Next, a third prepreg 270 and a third metal layer 280 are deposited in order (FIG. 3K).

Through the above processes, the embedded PCB 200 has the LC part built therein.

FIGS. 3L to 3P show the process of fabricating the pads 160a, 160b on the embedded PCB 200. Plural through-holes 285 are formed penetrating through the embedded PCB 200 (FIG. 3L). As shown in FIG. 3L, two through-holes 285 are formed, but the number of the through-holes 285 may be adequately adjusted for use. To form the through-hole 285, the aforementioned drilling methods can be used.

A fourth metal layer 287 is plated on both sidewalls of the through-hole 285 and the entire surface of the embedded PCB 200 (FIG. 3M), and patterned (FIG. 3N).

Next, a solder resist 290 is deposited on an inside of the through-hole 285 and the entire surface of the embedded PCB 200, that are plated with the fourth metal layer 287, and patterned in a predetermined pattern (FIG. 3O). The solder resist 290 is a thermal-resistant cladding material to cover certain areas of the PCB 200. Since solders cannot adhere to the certain areas of the PCB 200 covered by the solder resist 290, the certain areas of the PCB 200 are protected from solding.

Next, an area where the solder resist 290 has been removed by the patterning is plated, with a fifth metal layer 295, and as a result, the embedded PCB 200 is finalized as shown in FIG. 3P. The metal layers 220 to 295 may be copper.

Meanwhile, the process of fabricating the first and second filter 120, 130 may be performed according to a well-known FBAR fabrication process. In detail, the FBAR fabrication process is performed in a manner that an insulating layer is deposited on a separate silicon substrate, and a lower electrode, a piezoelectric layer and an upper electrode are deposited in order on the silicon substrate. An air gap type FBAR may be used, which is fabricated in a manner that a sacrificial layer is deposited on an insulating layer, and a lower electrode, a piezoelectric layer and an upper electrode are deposited, and the sacrificial layer is etched through a via hole.

FIG. 4 shows the process of fabricating the packaging substrate 140 to protect the duplexer. Referring to FIG. 4, a specific area of a separate PCB 140 is etched by using the photo resist layer (FIG. 4A), and a bonding material 141 is coated on a non-etched area for bonding. An adhesive such as an epoxy may be used as the bonding material.

FIG. 5 shows the final process of fabricating the duplexer according to an embodiment of the present invention, in which separately-made first and second filters 120, 130 are bonded on the embedded PCB 200 of FIG. 3 and the packaging substrate 140 of FIG. 4 is bonded thereon.

Specifically, FIG. 5A shows the process of fabricating the conductive bumps 150a, 150b on the pad 295 which is exposed on the embedded PCB 200. Next, the first and second filters 120, 130 are respectively connected to each conductive bumps 150a, 150b. Lower and upper electrodes of the first filter 120 are respectively connected to the conductive bump 150a, and the lower and upper electrodes of the second filter 130 are respectively connected to the conductive bump 150b.

Next, the packaging substrate 140 is bonded to the embedded PCB 200 using the bonding material 141, and the entire duplexer is packaged (FIG. 5C) to complete the process of fabricating the duplexer according to an embodiment of the present invention.

The isolation part 110 may be implemented with a quarter-wave ($\lambda/4$) transmission line instead of the LC part. The embedded PCB 200 having the quarter-wave ($\lambda/4$) transmission line therein is fabricated in a manner that a metal layer is plated on a PCB and patterned, and then a PCB is additionally bonded thereon. The process of fabricating the embedded PCB 200 having the quarter-wave ($\lambda/4$) transmission line therein is generally well known, and therefore a detailed illustration thereof will be omitted for conciseness.

By using the embedded PCB having the isolation part therein, the duplexer can have a reduced size. Hence, the high-integrated duplexer is achieved.

As described above with respect to a few embodiments of the present invention, by using the embedded PCB having the isolation part built therein, the duplexer can have the reduced size and the integration and the isolation effect. Further, since the transmitter/receiver filters do not require additional packaging, the cost is reduced and the processes are simplified. Also, the parasitic components are decreased, because the filters are connected using the bump.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A duplexer fabrication method comprising:
   (a) fabricating an embedded PCB having an isolation part built therein;
   (b) forming plural pads on certain areas of an upper side of the embedded PCB, to connect with an external terminal;
   (c) separately fabricating a first filter and a second filter, each having at least one film bulk acoustic resonator which is fabricated by depositing a lower electrode, a piezoelectric layer, and an upper electrode in order;
   (d) bonding the first and second filters respectively onto the plural pads formed on the embedded PCB; and
   (e) packaging an entire surface of the embedded PCB at a predetermined distance from the first and second filters respectively.

2. The method of claim 1, wherein the isolation part comprises a capacitor and a coil, the capacitor and the coil being fabricated by depositing a first metal layer, a dielectric, and a second metal layer on both sides of the PCB in order.

3. The method of claim 2, wherein the step (a) comprises:
   depositing the first metal layer on both sides of the PCB;
   depositing a photo resist layer on the first metal layer and forming a lower pattern of the coil by etching;
   depositing a first prepreg and the dielectric in order on the lower pattern of the coil, and patterning the dielectric in a predetermined pattern;

depositing a second prepreg and a second metal layer on the patterned dielectric in order;

fabricating an upper pattern of the coil by half-etching and patterning the second metal layer;

exposing the lower pattern of the coil by drilling an area where the second metal layer is removed by the patterning;

connecting the lower and upper patterns of the coil by metal-plating the drilled area;

fabricating the coil by partially etching the metal-plated area; and depositing a third prepreg and a third metal layer on the coil in order.

4. The method of claim 1, wherein the isolation part comprises a transmission line fabricated between plural PCBs deposited in order and having a length corresponding to ¼ of a frequency of a signal passed by the first filter or the second filter.

5. The method of claim 1, wherein the step (b) comprises:

forming two through-holes by penetrating certain areas of the embedded PCB;

plating upper and lower surfaces of the embedded PCB and both sidewalls of each of the through-holes with a fourth metal layer;

depositing and patterning a solder resist on an inside of each of the plated through-hole and the upper and lower surfaces of the embedded PCB; and plating the upper and lower surfaces of the embedded PCB with a fifth metal layer at an area where the solder resist is not deposited.

6. The method of claim 1, wherein the step (d) comprises:

fabricating a conductive bump on an upper portion of each of the plural pads; and bonding the first and second filters respectively to the conductive bump at a predetermined air gap with respect to an upper side of the embedded PCB.

7. The method of claim 1, wherein the step (e) comprises:

fabricating a packaging substrate by etching a certain area of an additional PCB;

coating a bonding material on an area except the etched area on the additional PCB; and bonding the packaging substrate to the embedded PCB so that the first and second filters are located in the etched area and separated from each other by a predetermined distance.

* * * * *